(12) United States Patent
Makimura et al.

(10) Patent No.: US 7,521,711 B2
(45) Date of Patent: Apr. 21, 2009

(54) DISPLAY DEVICE, METHOD OF PRODUCTION OF THE SAME, AND PROJECTION TYPE DISPLAY DEVICE

(75) Inventors: Shingo Makimura, Kanagawa (JP); Makoto Hashimoto, Kanagawa (JP); Yoshiro Okawa, Kagoshima (JP); Tomohiro Wada, Kumamoto (JP); Kazunori Kataoka, Kanagawa (JP)

(73) Assignee: Sony Corporation, Tokyo (JP)

( * ) Notice: Subject to any disclaimer, the term of this patent is extended or adjusted under 35 U.S.C. 154(b) by 87 days.

(21) Appl. No.: 11/251,430

(22) Filed: Oct. 14, 2005

(65) Prior Publication Data
US 2006/0033103 A1    Feb. 16, 2006

Related U.S. Application Data

(62) Division of application No. 10/485,790, filed on Feb. 4, 2004, now Pat. No. 7,189,993.

(30) Foreign Application Priority Data

Jun. 7, 2002   (JP)  ............................. 2002-166380
Jun. 6, 2003   (WO)  ....................... PCT/JP03/07208

(51) Int. Cl.
   *H01L 29/04*    (2006.01)
(52) U.S. Cl. ............................. 257/59; 257/65; 257/66
(58) Field of Classification Search ................... 257/59, 257/66, 72, 347, 57, 350, 351
   See application file for complete search history.

(56) References Cited

U.S. PATENT DOCUMENTS 5,208,476 A * 5/1993 Inoue .......................... 257/408
5,294,811 A * 3/1994 Aoyama et al. ............... 257/59
2003/0210363 A1* 11/2003 Yasukawa et al. ........... 349/110

FOREIGN PATENT DOCUMENTS

JP      09266316 A  * 10/1997
JP    409266316 A  * 10/1997

* cited by examiner

*Primary Examiner*—Thinh T Nguyen
(74) *Attorney, Agent, or Firm*—Robert J. Depke; Rockey, Depka & Lyons, LLC.

(57) ABSTRACT

A display device able to raise a light resistance of pixel transistors without depending upon a light shielding structure and a method of production of same, wherein an average crystal grain size of a polycrystalline silicon film 111 forming an active layer of the pixel transistors is controlled to be relatively small so as to suppress a photo-leakage current. The smaller the crystal grain size, the larger the included crystal defects. Carriers excited by light irradiation are smoothly captured by a defect level, and an increase of a photo-leakage current is suppressed. On the other hand, the average crystal grain size of the polycrystalline silicon film 111 constituting the peripheral transistors is controlled so as to become relatively large. The larger the crystal grain size, the larger the mobility of the carriers, and the higher the drivability of the peripheral transistors. This is because a higher speed operation is required for the peripheral transistors than the pixel transistors due to scanning of pixels and sampling of image signals.

10 Claims, 14 Drawing Sheets

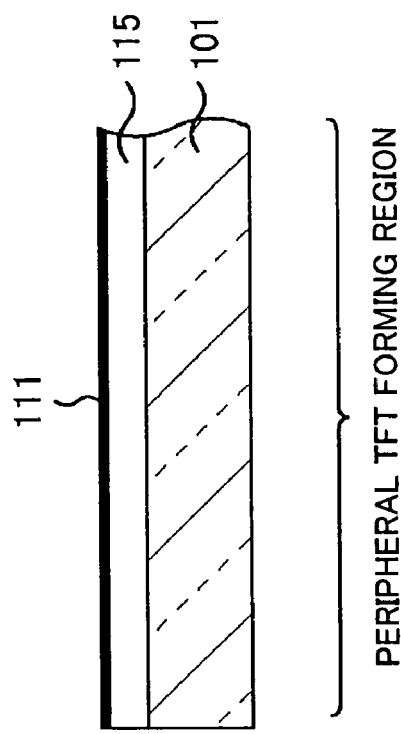
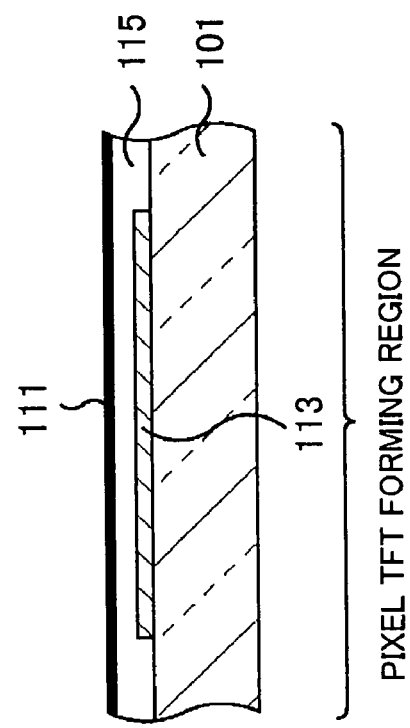
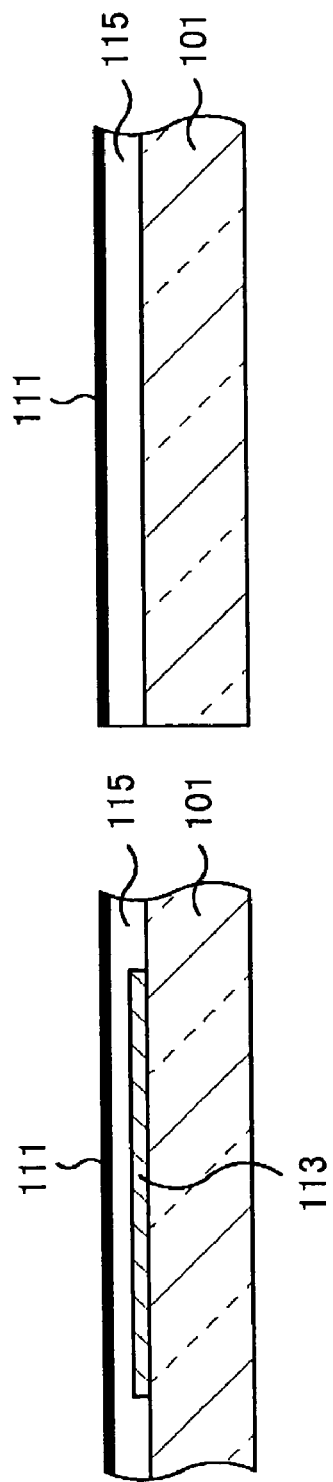
FIG. 7A
FIG. 7B

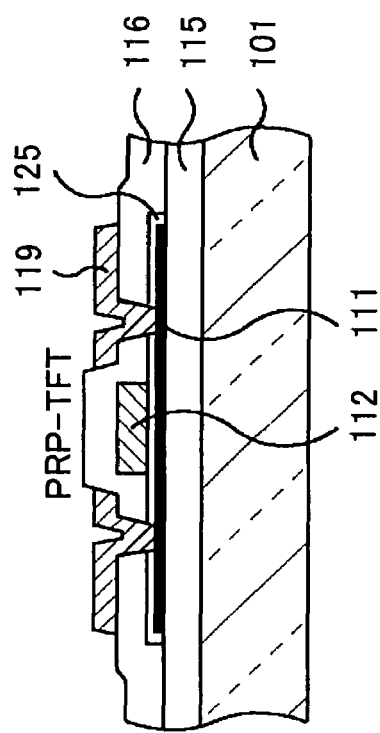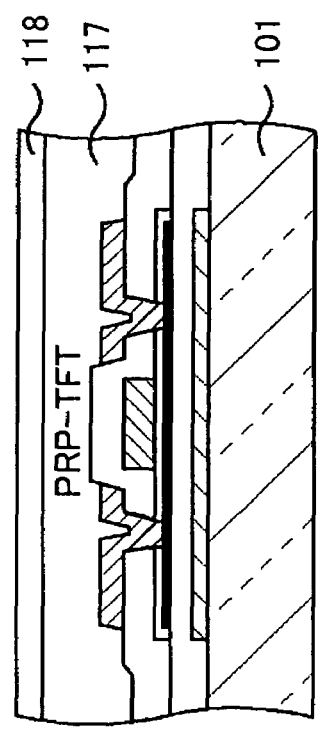
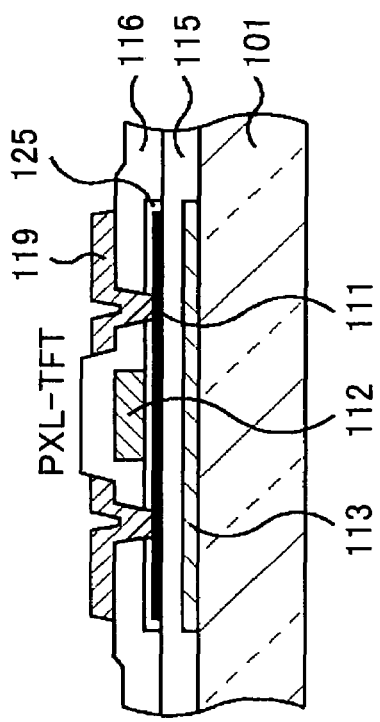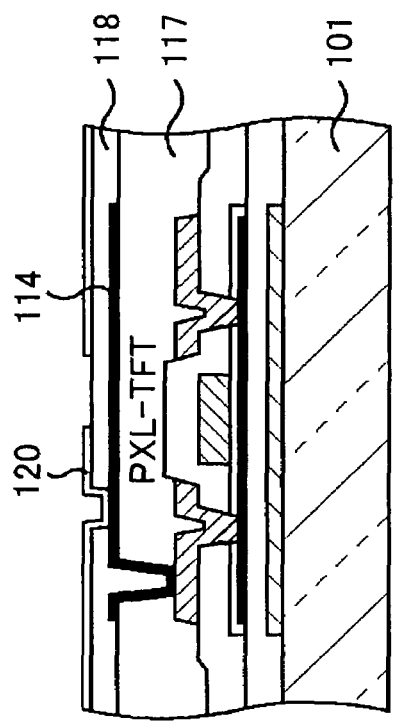
FIG. 9A
FIG. 9B

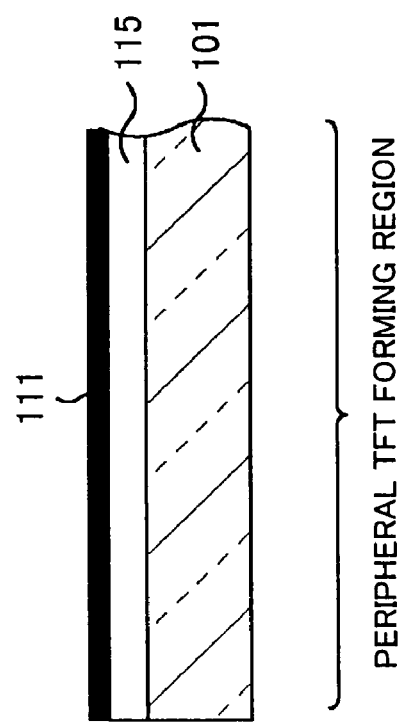
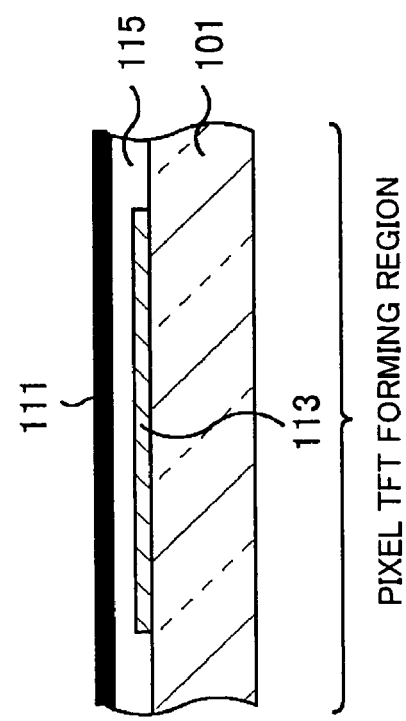
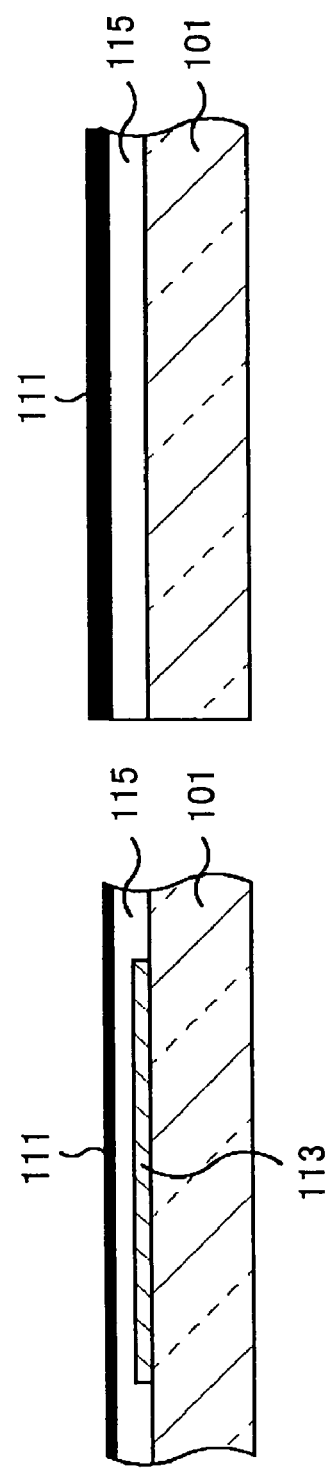
FIG. 10A
FIG. 10B

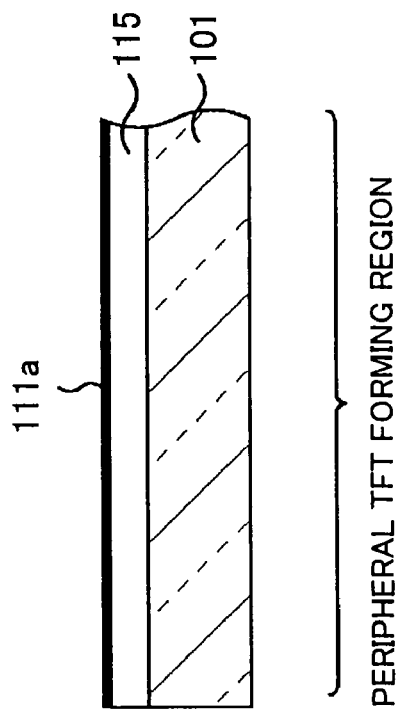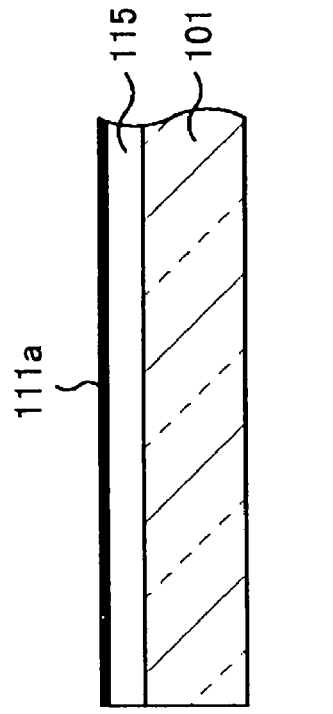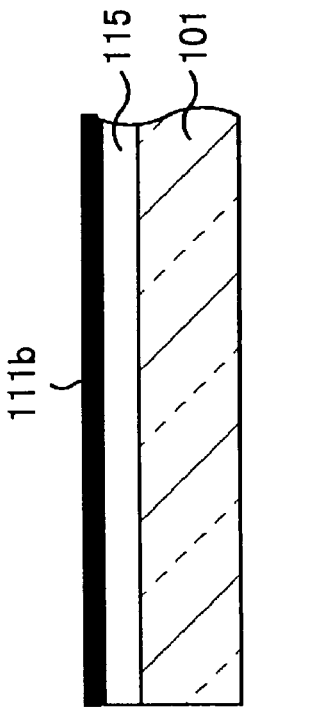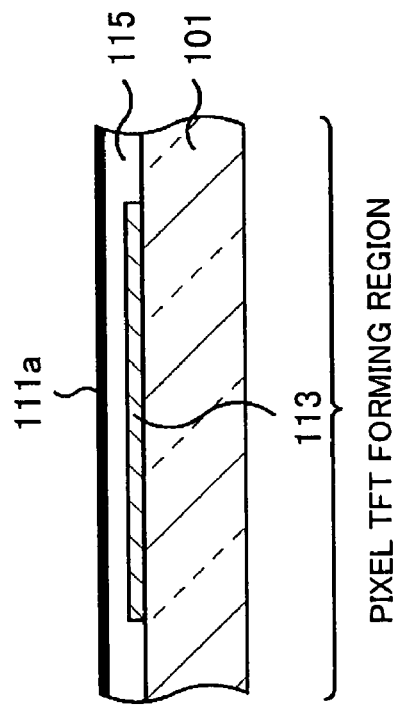
FIG. 12A  FIG. 12B  FIG. 12C

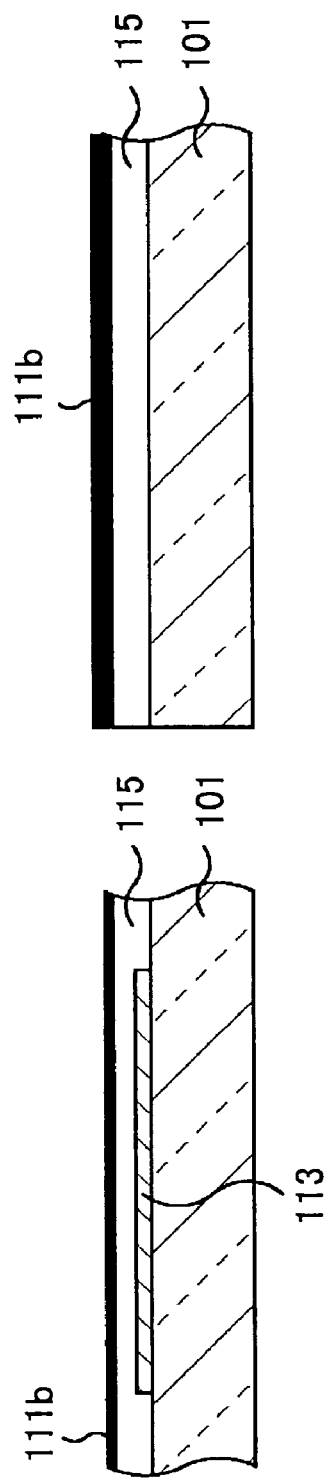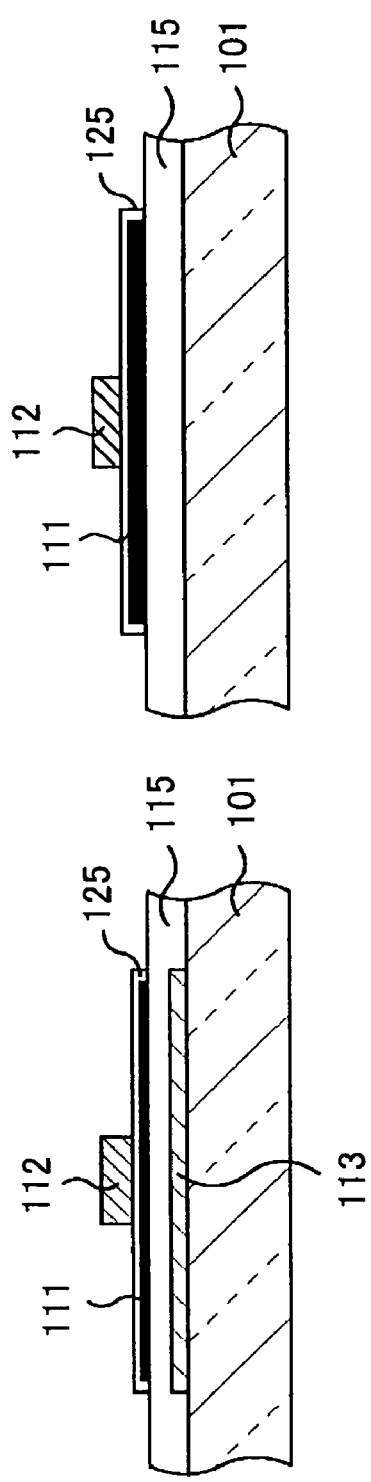
FIG. 13A
FIG. 13B

DISPLAY DEVICE, METHOD OF PRODUCTION OF THE SAME, AND PROJECTION TYPE DISPLAY DEVICE

The subject matter of application Ser. No. 10/485,790, is incorporated herein by reference. The present application is a divisional of U.S. application Ser. No. 10/485,790, filed Feb. 4, 2004 now U.S. Pat. No. 7,189,993, which claims priority to Japanese Patent Application No. JP2002-166380, filed Jun. 7, 2002, and WIPO Patent Application Nos. PCT/JP2003/07208, filed Jun. 6, 2003. The present application claims priority to these previously filed applications.

TECHNICAL FIELD

The present invention relates to a flat type display device represented by a liquid crystal display device (LCD), a method of production of the same, and a projection type display device. In more detail, the present invention relates to an active matrix type display comprised of an active matrix configuration pixel array (display unit) and a peripheral drive unit integrally formed, a method of production of the same, and a projection type display device. Further concretely, it relates to the configuration of a thin film transistor included in the display unit and the drive unit.

BACKGROUND ART

FIG. 1 is a schematic perspective view showing an overall configuration of a general active matrix type display device.

As shown in FIG. 1, this display device has a flat structure comprising a display panel 10 and provided with a pair of glass substrates 11 and 12 and an electrooptic material held between them. As the electrooptic material, use is made of for example a liquid crystal 13.

The glass substrate 11 is formed with a display unit 14 and a peripheral drive unit integratedly formed. The drive unit formed on the glass substrate 11 includes a vertical drive circuit 15 and a horizontal drive circuit 16. One peripheral edge of the substrate 11 is formed with terminals 17 for external connection. The terminals 17 are connected via interconnects 18 to the vertical drive circuit 15 and the horizontal drive circuit 16.

The display unit 14 is formed with pixel circuits, each including a pixel electrode 14a and a thin film transistor (TFT) 14b driving the same, in a matrix. A gate interconnect 19G is formed for every row and a signal interconnect 19S is formed for every column of the matrix array of the pixel circuits. Each pixel circuit is arranged at an intersecting portion of two interconnects, a gate electrode of the TFT 14b is connected to a corresponding gate interconnect 19G, a drain region is connected to a corresponding pixel electrode 14a, and a source region is connected to the corresponding signal interconnect 19S. The gate interconnects 19G are connected to the vertical drive circuit 15, and the signal interconnects 19S are connected to the horizontal drive circuit 16.

On the other hand, an inner surface of the glass substrate 12 facing the glass substrate 11 is formed with not shown a counter electrode. The counter electrode is arranged facing the pixel electrodes 14a. Individual pixels are formed by the pixel electrodes 14a, the counter electrode, and the liquid crystal 13 held between the two.

A TFT 14b, as explained above, is provided corresponding to each pixel and switches each pixel ON and OFF. In the present specification, a TFT for pixel switching formed in the display unit 14 will be sometimes referred to as a "pixel transistor". On the other hand, the peripheral vertical drive circuit 15 and the horizontal drive circuit 16 also include TFTs (thin film transistors) formed by integration simultaneously parallel to the pixel transistors. Below, in this specification, the TFTs configuring the peripheral drive circuits 15 and 16 will be sometimes referred to as "peripheral transistors". Both the pixel transistors and the peripheral transistors comprise TFTs (thin film transistors) formed by stacking a polycrystalline semiconductor thin film (for example, polycrystalline silicon film) and gate electrodes via gate insulating films.

FIG. 2 is a view of an example of the configuration of a projection type display (hereinafter, referred to as a "projector") using the liquid crystal display panel 10 shown in FIG. 1.

This projector 20 has, as shown in FIG. 2, a structure comprised of a light source 21, a transmission type liquid crystal display panel 10A sandwiched by a pair of polarization plates 22 and 23, and an enlargement projection optical system 24 arranged in order along the optical axis. Here, the liquid crystal display panel 10A has the flat structure shown in FIG. 1. The light source 21 is configured by an elliptical reflection mirror 25 and a lamp 26 arranged at the center thereof and radiates high intensity illumination light to an arrangement direction of the liquid crystal display panel 10A (front side). The front surface of the light source 21 is provided with a filter 27 which absorbs the unnecessary UV-ray component and infrared ray component included in the illumination light. Further in front of this is arranged a condenser lens 28 which condenses the illumination light and makes it strike the entire surface of the light incident side of the liquid crystal display panel 10A. The enlargement projection optical system 24 is arranged on the light transmission side (front) of the liquid crystal display panel 10A and enlarges and projects an image formed by a display unit 14A of the liquid crystal display panel 10A to the front. The enlarged and projected image is formed on a screen 29.

The liquid crystal display panel 10A is divided into for example a normally white mode display unit 14A and a peripheral nondisplay unit 212. The nondisplay unit 14B includes for example a peripheral drive circuit. A pair of polarization plates 22 and 23 are arranged so that their polarization axes are orthogonal. The display unit 14A of the liquid crystal display panel 10A includes a twist oriented liquid crystal and has an optical rotatory power of 90 degrees with respect to the incident light. On the other hand, the pair of polarization plates 22 and 23 are crossed-Nicol arranged. Accordingly, linearly polarized light passing through the incident side polarization plate 22 is rotated about its polarization axis 90 degrees by the liquid crystal included in the display unit 14A and passes through the emission side polarization plate 23. Accordingly, a normally white mode display is obtained, and an enlarged and projected image is formed on the screen 29.

Projection display devices (projectors) using liquid crystal display device (LCD) in this way are rapidly spreading along with the improvement of brightness since large screen displays are easily obtained.

A projector is a device having a strong light source, controlling the image by a liquid crystal display acting as a light valve, and enlarging and projecting the image information. Strong light strikes the liquid crystal display device. Due to requests for further improvement of the screen luminance or reduction of size of projectors, the amount of incident light per unit area of the liquid crystal display device is becoming increasingly larger.

On the other hand, reflection light etc. generated inside the optical system or liquid crystal display device due to strong incident light strikes the active layers of some pixel transistors, so leakage current (hereinafter referred to as a "photo-leakage current") caused by optical excitation is caused. An increase of the photo-leakage current becomes a cause of flicker and roughness of the screen, so gives a fatal defect to the image quality.

In the past, in order to cope with the increase of the amount of incident light, a light shielding structure for shielding the pixel transistors from the top and the bottom has been formed. By arranging metallic films or silicide films in a manner covering the incident side and the emission side of the pixel transistors and optimizing the shapes and dimensions thereof, it was possible to shield the pixel transistors from light and hold or improve the image quality.

However, the light shielding structure inevitably sacrifices the numerical aperture of the pixels, so runs contrary to the requests for higher luminance of the screen. Due to the necessity of improvement of the numerical aperture of the liquid crystal display panel, it has already become difficult to sufficiently secure the light shielding area.

DISCLOSURE OF THE INVENTION

An object of the present invention is to provide a display device raised in light resistance of the pixel transistors without depending upon the light shielding structure, that is, is able to achieve both a high numerical aperture of the pixels and a high light resistance of the pixel transistors, a method of production of the same, and a projection type display.

To attain the above object, the following means were devised. Namely, a first aspect of the present invention is a display device provided with a substrate on which display unit and a peripheral drive unit are integrally formed, the display unit having pixels arranged in a matrix and pixel transistors switching them ON and OFF integratedly formed, the drive unit having peripheral transistors configuring a drive circuit for scanning the matrix of the pixel transistors integratedly formed, and both of the pixel transistors and peripheral transistors being comprised of thin film transistors obtained by stacking polycrystalline semiconductor thin films and gate electrodes via gate insulating films, wherein an average crystal grain size of the semiconductor thin film of the pixel transistors and an average crystal grain size of the semiconductor thin film of the peripheral transistors are different.

Specifically, the average crystal grain size of the semiconductor thin film of the pixel transistors is smaller than the average crystal grain size of the semiconductor thin film of the peripheral transistors. Further, the semiconductor thin film is polycrystalline silicon. Further, the average crystal grain size of the polycrystalline silicon constituting the semiconductor thin film of the pixel transistors is 300 nm or less, and the average crystal grain size of the polycrystalline silicon constituting the semiconductor thin film of the peripheral transistors is 800 nm or more. Further, the thickness of the polycrystalline silicon is 25 to 50 nm.

Further, a second aspect of the present invention is a method of production of a display device provided with a substrate on which display unit and a peripheral drive unit are integrally formed, the display unit having pixels arranged in a matrix and pixel transistors switching them ON and OFF integratedly formed, the drive unit having peripheral transistors configuring a drive circuit for scanning the matrix of the pixel transistors integratedly formed, and both of the pixel transistors and peripheral transistors being comprised of thin film transistors obtained by stacking polycrystalline semiconductor thin films and gate electrodes via gate insulating films, including a film forming step of forming a polycrystalline silicon film over the display unit and the drive unit of the substrate; an ion implantation step of implanting inactive ions not exerting any influence upon electric characteristics of the active layer into the polycrystalline silicon film so as to convert it once to an amorphous silicon film; and a recrystallization step of heat treating the amorphous silicon film so as to obtain the polycrystalline silicon film again, wherein the ion implantation step is carried out so that the ion implantation amount differs between the display unit and drive unit and thereby an average crystal grain size of the polycrystalline silicon film of the pixel transistors and an average crystal grain size of the polycrystalline silicon film of the peripheral transistors obtained in the recrystallization step differ.

Preferably, the recrystallization step is by a solid phase growth process loading the substrate into a furnace set to 580° C. or more in a nitrogen atmosphere to perform heat treatment for a predetermined time. Alternatively, the recrystallization step is by a laser annealing process irradiating a laser beam to the substrate to perform heat treatment. Further, the ion implantation step is carried out so that the ion implantation amount becomes smaller in the display unit than that in the drive unit and thereby the average crystal grain size of the polycrystalline silicon film of the pixel transistors obtained in the recrystallization step becomes smaller than the average crystal grain size of the polycrystalline silicon film of the peripheral transistors. Further, the recrystallization step controls the average crystal grain size of the polycrystalline silicon film of the pixel transistors to 300 nm or less and controls the average crystal grain size of the polycrystalline silicon film of the peripheral transistors to 800 nm or more. Further, the film forming step forms the polycrystalline silicon film in a range of thickness from 25 to 50 nm.

Further, a third aspect of the present invention is a method of production of a display device provided with a substrate on which display unit and a peripheral drive unit are integrally formed, the display unit having pixels arranged in a matrix and pixel transistors switching them ON and OFF integratedly formed, the drive unit having peripheral transistors configuring a drive circuit for scanning the matrix of the pixel transistors integratedly formed, and both of the pixel transistors and peripheral transistors being comprised of thin film transistors obtained by stacking polycrystalline semiconductor thin films and gate electrodes via gate insulating films, including a film forming step of forming a silicon crystalline silicon film or a polycrystalline silicon film over the display unit and the drive unit of the substrate; an ion implantation step of implanting inactive ions not exerting any influence upon electric characteristics of the active layer into the polycrystalline silicon film so as to convert it once to an amorphous silicon film; and a recrystallization step of heat treating the amorphous silicon film so as to obtain the polycrystalline silicon film again, the film forming step forming the film so that the thickness of the polycrystalline silicon constituting the active layer of the pixel transistors becomes thinner than the thickness of the polycrystalline silicon constituting the active layer of the peripheral transistors and thereby an average crystal grain size of the polycrystalline silicon film of the pixel transistors and an average crystal grain size of the polycrystalline silicon film of the peripheral transistors obtained in the recrystallization step differ.

Preferably, the film forming step comprises a first step of forming a single crystalline silicon film or a polycrystalline silicon film up to a first thickness over the display unit and the drive unit of the substrate and a second step of selectively removing the single crystalline silicon film or the polycrystalline silicon film formed in the display unit of the substrate up to a second thickness. Further, preferably, the film forming step comprises a first step of forming a single crystalline silicon film or a polycrystalline silicon film up to a predetermined thickness over the display unit and the drive unit of the substrate; a second step of once removing the single crystalline silicon film or the polycrystalline silicon film formed in the display unit of the substrate; and a third step of further forming a single crystalline silicon film or a polycrystalline silicon film over the display unit and the drive unit of the substrate.

Further, a fourth aspect of the present invention is a projection type display device for emitting light of a light source to at least one display panel to project an image formed by that display panel to a screen, wherein the display panel is provided with a substrate on which display unit and a peripheral drive unit are integrally formed, the display unit having pixels arranged in a matrix and pixel transistors switching them ON and OFF integratedly formed, the drive unit having peripheral transistors configuring a drive circuit for scanning the matrix of the pixel transistors integratedly formed, and both of the pixel transistors and peripheral transistors being comprised of thin film transistors obtained by stacking polycrystalline semiconductor thin films and gate electrodes via gate insulating films, wherein an average crystal grain size of the semiconductor thin film of the pixel transistors and an average crystal grain size of the semiconductor thin film of the peripheral transistors are different.

According to the present invention, by optimizing the crystal grain sizes of the polycrystalline silicon film of the pixel transistors and the polycrystalline silicon film of the transistors of the peripheral drive circuit, the light resistance of the pixel transistors can be greatly enhanced and, the electric characteristics of the peripheral transistors can be maintained well. Specifically, by controlling the average crystal grain size of the polycrystalline silicon film forming the active layer of the pixel transistors to be relatively small, a photo-leakage current can be suppressed. The smaller the crystal grain size, the larger the number of crystal defects. It is considered that carriers excited by the light irradiation are smoothly captured by a defect level, consequently an off resistance of the transistors increases, and an increase of the photo-leakage current is suppressed. On the other hand, the average crystal grain size of the polycrystalline silicon film constituting the peripheral transistors is controlled so as to become relatively large. The larger the crystal grain size, the larger the mobility of the carriers and the higher the drivability of the peripheral transistors. A higher speed operation is required from the peripheral transistors than the pixel transistors for scanning of pixels and sampling of image signals. In the present invention, the drivability of the peripheral transistors is secured to maintain the image quality.

BRIEF DESCRIPTION OF THE INVENTION

FIG. 3 is a schematic view of an embodiment of a display device according to the present invention, wherein

FIGS. 7A and 7B are process diagrams of a first method of production of a display device according to the present invention.

FIGS. 9A and 9B are process diagrams of a first method of production of a display device according to the present invention.

FIGS. 10A and 10B are process diagrams of a second method of production of the display device according to the present invention.

FIGS. 12A and 12B AND 12C are process diagrams of a third method of production of the display device according to the present invention.

FIGS. 13A and 13B are process diagrams of a third method of production of the display device according to the present invention.

BEST MODE FOR WORKING THE INVENTION

Below, a detailed explanation will be given of embodiments of the present invention in relation to the drawings.

Figure 3A:
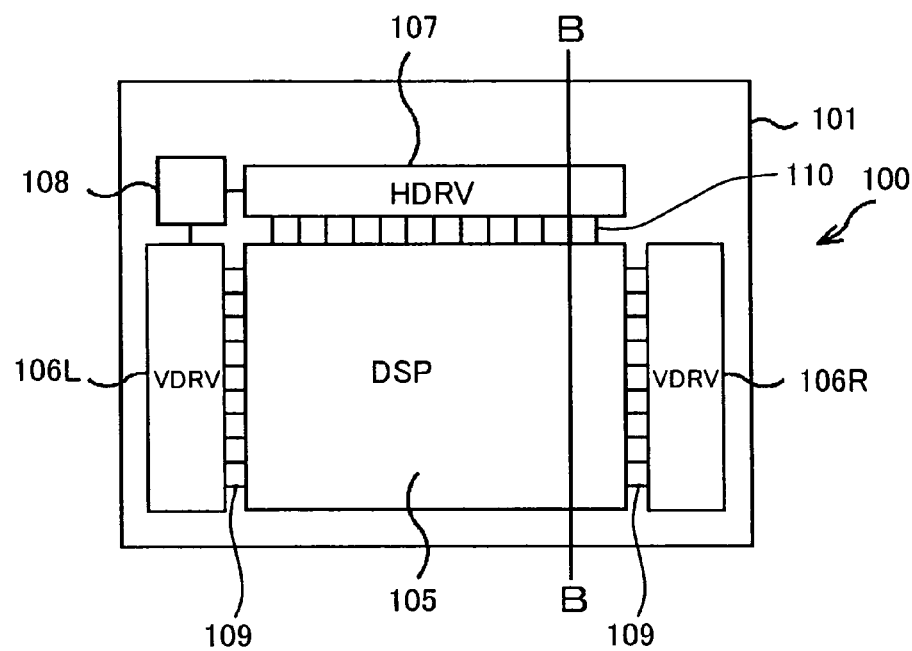
FIG. 3A shows the layout of a display unit and a drive unit formed in a display panel.
Figure 3B:
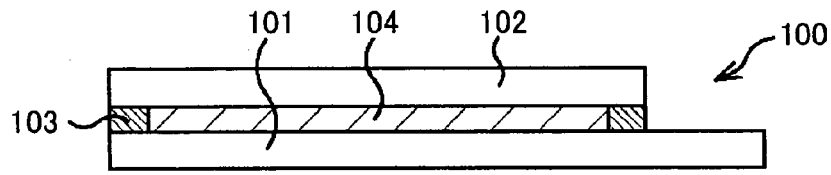
FIG. 3B shows a sectional structure of the display panel cut along for example a line B-B of FIG. 3A.

FIG. 3 is a schematic view of an embodiment of a display device according to the present invention, in which FIG. 3A shows a layout of a display unit and a drive unit formed at a display panel; and FIG. 3B shows a sectional structure of the display panel cut along for example a line B-B of FIG. 3A.

Figure 1:
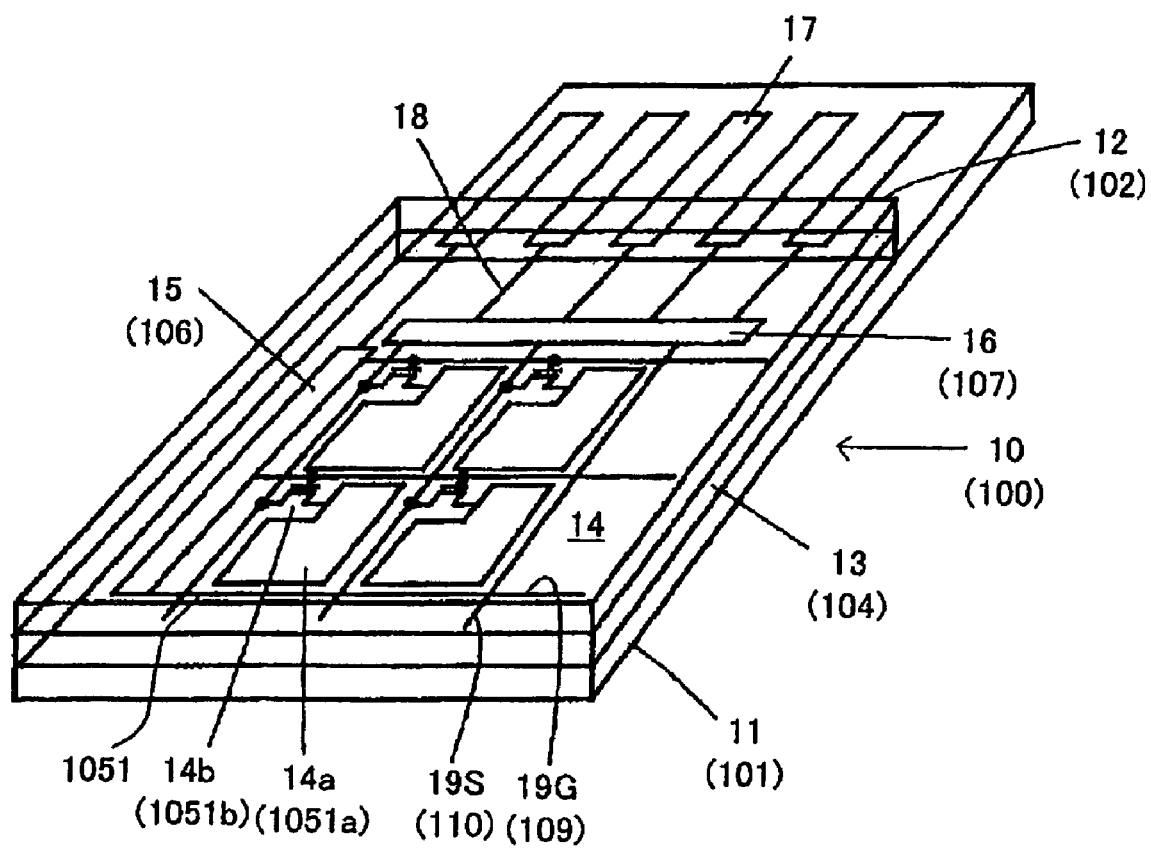
FIG. 1 is a schematic perspective view of the overall configuration of a general active matrix type display device.

A display panel 100 has, as shown in the figure, a flat structure obtained by bonding a pair of glass substrates 101 and 102 by a sealing material 3. A gap between the pair of glass substrates 101 and 102 is filled with for example a liquid crystal 104 as an electrooptic material. In some cases, use can be made of another electrooptic material in place of a liquid crystal. The surface of the glass substrate 101, as shown in FIG. 3A, is integrally formed with the display unit and the peripheral drive unit. The inner surface of the glass substrate 102 facing this is formed with a counter electrode. Such a flat panel type active matrix display device basically has a structure the same as the structure shown in FIG. 1 and is used as for example a light valve of the projector shown in FIG. 2, that is, a liquid crystal display panel 10A.

In the present display device, as shown in FIG. 3, the glass substrate 101 is integrally formed with a display unit (DPS) 105 and a peripheral drive unit. The peripheral drive unit includes a pair of left and right vertical drive circuits (VDRV) 106L and 106R, a horizontal drive circuit (HDRV) 107, and a level conversion circuit 108 for scanning the matrix of the pixel transistors of the display unit 105 and are arranged so as to surround the display unit 105.

The display unit 105 is integratedly formed with pixel circuits arranged in a matrix and pixel transistors for switching them ON and OFF. For example, when explaining this with reference to FIG. 1, the display unit 105 is formed with pixel circuits 1051 including pixel electrodes 1051*a* and TFTs (thin film transistors) 1051*b* for driving them in a matrix. Then, a gate interconnect 109 is formed for every row, and a signal interconnect 110 is formed for every column of the matrix array of the pixel circuits 1051. Each pixel circuit 1051 is arranged at an intersecting portion of two interconnects, a gate electrode of the TFT 1051*b* is connected to the corresponding gate interconnect 109, a drain region is connected to the corresponding pixel electrode 1051*a*, and a source region is connected to the corresponding signal interconnect 110. The gate interconnects 109 are connected to the vertical drive circuits 106L and 106R, and the signal interconnects 110 are connected to a horizontal drive circuit 107.

Note that the level conversion circuit 108 converts a potential level of clock signals etc. supplied from the outside and supplies this to the vertical drive circuits 106L and 106R and the horizontal drive circuit 107.

The peripheral drive unit including these vertical drive circuits (VDRV) 106L and 106R, the horizontal drive circuit (HDRV) 107, and the level conversion circuit 108 is configured by peripheral transistors formed by integration simultaneously and parallel with the pixel transistors. Both the pixel transistors and peripheral transistors according to the present embodiment comprise TFTs (thin film transistors) obtained by stacking polycrystalline semiconductor thin films and gate electrodes via gate insulating films.

The characterizing feature of the present invention is that the average crystal grain size of the semiconductor thin film of the pixel transistors and the average crystal grain size of the semiconductor thin film of the peripheral transistors are different. Specifically, the average crystal grain size of the semiconductor thin film of the pixel transistors is smaller than the average crystal grain size of the semiconductor thin film of the peripheral transistors. As the semiconductor thin film, polycrystalline silicon is mainly used. In this case, the average crystal grain size of the polycrystalline silicon constituting the semiconductor thin film of the pixel transistors is controlled to 300 nm or less, and the average crystal grain size of the polycrystalline silicon constituting the semiconductor thin film of the peripheral transistors is controlled to 800 nm or more. The thickness of the polycrystalline silicon is controlled to 25 to 50 nm.

Figure 4A:
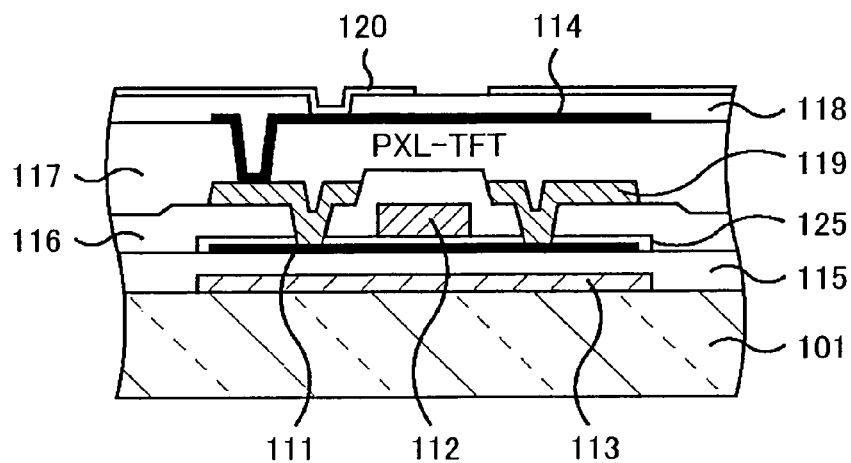
FIG. 4A is a view of a sectional structure of a pixel transistor (pixel TFT: PXL-TFT)
Figure 4B:
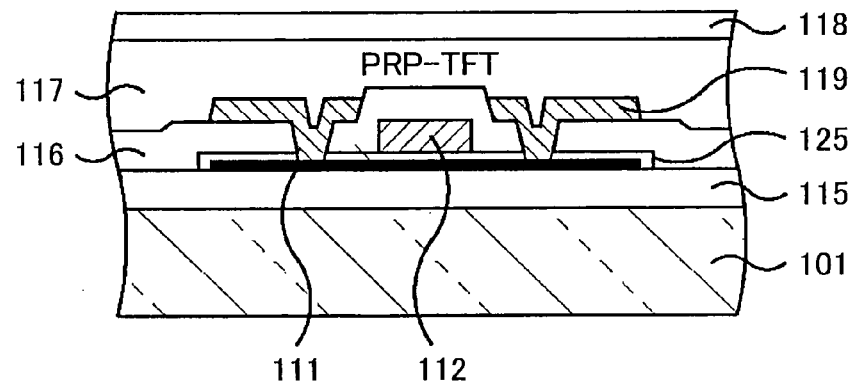
FIG. 4B is a view of a sectional structure of a peripheral transistor (peripheral TFT: PRP-TFT).

FIG. 4A is a view of the sectional structure of a pixel transistor (pixel TFT: PXL-TFT); and FIG. 4B is a view of the sectional structure of a peripheral transistor (peripheral TFT: PRP-TFT).

In a pixel transistor, as shown in FIG. 4A, a substrate 101 has a first light shielding film 113 formed on its surface. The substrate 101 and the first light shielding film 113 have a first inter-layer insulating film 115 formed on them, while the first inter-layer insulating film 115 has a polycrystalline silicon film 111 formed on it. The polycrystalline silicon film 111 has a gate electrode 112 formed on it via a gate insulating film 125.

In this way, a pixel TFT basically has a stacked structure comprised of a polycrystalline silicon film 111 and gate electrode 112 superposed via a gate insulating film 125. The pixel TFT is covered by a second inter-layer insulating film 116, and interconnects 119 are formed on this. The interconnects 119 include a signal interconnect connected to the source region of the pixel TFT via a contact hole opened in the second inter-layer insulating film 116. This signal interconnect 119 acts also as a second light shielding film. The interconnect 119 is covered by a third inter-layer insulating film 117, and a third light shielding film 114 is formed on this. The third light shielding film 114 is covered by a fourth inter-layer insulating film 118, and a pixel electrode 120 made of a transparent conductive film such as ITO is formed on that. The pixel electrode 120 is electrically connected to the drain region of the pixel TFT via the third light shielding film and the interconnect 119.

In a peripheral TFT, as shown in FIG. 4B, a substrate 101 has a polycrystalline silicon film 111 formed on it via a first inter-layer insulating film 115. On that, a gate electrode 112 is formed via a gate insulating film 125. This structure is the basic structure of the peripheral TFT. The peripheral TFT is covered by a second inter-layer insulating film 116, and interconnects 119 are formed thereon. The interconnects 119 are covered by a third inter-layer insulating film 117 and a fourth inter-layer insulating film 118.

The peripheral TFTs are formed simultaneously and parallel to the pixel TFTs and basically have the same layered configurations. Note that the peripheral TFTs do not need a high degree of light shielding unlike the pixel TFTs, so the first light shielding film 113 and the third light shielding film 114 are omitted.

The pixel TFTs and the peripheral TFTs shown in FIGS. 4A and 4B are basically prepared simultaneously and parallel by a film forming step, ion implantation step, and recrystallization step.

In the film forming step, a polycrystalline silicon film 111 is formed over the display unit and the drive unit of the substrate 101. In the ion implantation step, inactive ions not exerting an influence upon electric characteristics of the active layer are implanted into the polycrystalline silicon film 111 to convert it once to amorphous silicon film. As the inactive ions not exerting an influence upon the electric characteristics, for example $Si^+$ ions can be mentioned. Other than this, $SiF_3^+$ ions can be used. In the recrystallization step, the amorphous silicon film is heat treated to obtain a polycrystalline silicon film again.

A characterizing feature of the present invention is that the ion implantation step is carried out so that the ion implantation amount is different between for example the display unit and the drive unit and thereby the average crystal grain size of the polycrystalline silicon film 11 of the pixel TFTs and the average crystal grain size of the polycrystalline silicon film 11 of the peripheral TFTs obtained in the recrystallization step differ.

The recrystallization step is by a solid phase growth process loading the substrate 1 into a furnace set to 600° C. or more in a nitrogen atmosphere to perform heat treatment for a predetermined time. Alternatively, the recrystallization step can employ a laser annealing process irradiating a laser beam such as an excimer laser to the substrate for performing heat treatment.

The ion implantation step is carried out so that the ion implantation amount becomes smaller in the display unit than that in the peripheral drive unit to thereby make the average crystal grain size of the polycrystalline silicon film of the pixel TFTs obtained in the recrystallization step smaller than the average crystal grain size of the polycrystalline silicon film of the peripheral transistors. Preferably, the recrystallization step is adjusted so that the average crystal grain size of the polycrystalline silicon film 11 of the pixel TFTs becomes 300 nm or less and the average crystal grain size of the polycrystalline silicon film 11 of the peripheral TFTs becomes 800 nm or more.

Figure 5:
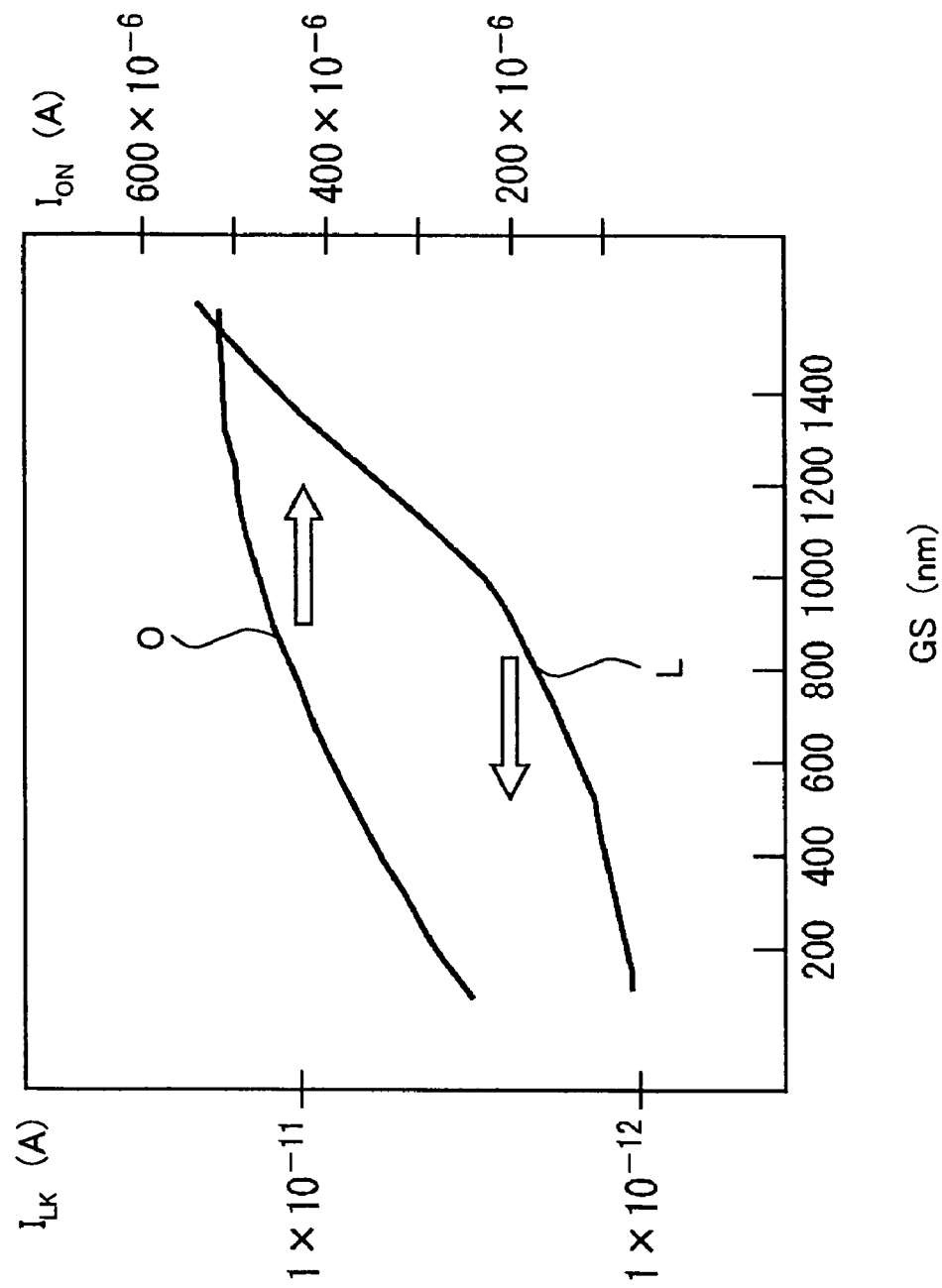
FIG. 5 is a graph of the relationships among an average grain size of a polycrystalline silicon, a photo-leakage current of a pixel TFT, and an ON current of a peripheral TFT.

FIG. 5 is a graph showing the relationships among the average grain size of the polycrystalline silicon, the photo-leakage current of the pixel TFTs, and the ON current of the peripheral TFTs. In FIG. 5, the abscissa represents the average grain size (GS) of the polycrystalline silicon, the ordinate on the left side in the figure represents a photo-leakage current ILK of the pixel TFTs, and the ordinate on the right side in the figure represents an ON current ION of the peripheral TFTs. Further, a curve indicated by L in the figure shows the characteristic of the photo-leakage current of the pixel TFTs with respect to the average grain size of the polycrystalline silicon, and a curve indicated by O shows the characteristic of the ON current of the peripheral TFTs with respect to the average grain size of the polycrystalline silicon. Note that measurement was carried out while setting the gate-source voltages Vgs of the pixel TFTs and the peripheral TFTs to −6V, and drain-source voltages Vds to 10V under irradiation of light. In this case, about 3000 to 5000 lx of light is irradiated onto the transistors by an ultra-high pressure mercury lamp (for example UHP lamp (produced by Philips Ltd.)) or a metal halide lamp. At this time, in the lamp, a 50% cut UV-ray cut filter of 425 nm and an infrared ray (IR) cut filter are disposed, and the measurement is carried out under conditions cutting unnecessary light.

As shown in FIG. 5, the larger the average grain size of the polycrystalline silicon, the larger the photo-leakage current of the pixel TFTs too. Further, the ON current of the peripheral TFTs increases as the average grain size of the polycrystalline silicon becomes larger. Based of these relationships, in the present embodiment, the average crystal grain sizes of the polycrystalline silicon of the pixel transistors and the polycrystalline silicon of the peripheral transistors are made different and optimized.

It is confirmed by experiments that by reducing the grain size of the polycrystalline silicon, the leakage current at the time of irradiation by light can be suppressed. By the reflection in the optical system and a multiple reflection or diffraction inside the liquid crystal display, part of the incident light which had become stray light easily hits the channel portion of the pixel TFTs. Due to this, the photo-leakage current of the pixel transistors increases and exerts an adverse influence upon the image quality. In order to maintain the image quality, it is necessary to suppress the leakage current at the time of light irradiation to 2 pA or less in the case of a liquid crystal display device writing frame image information into the display unit at a refresh rate of for example 60 Hz. Preferably, it is controlled to approximately 1 pA or less.

Figure 2:
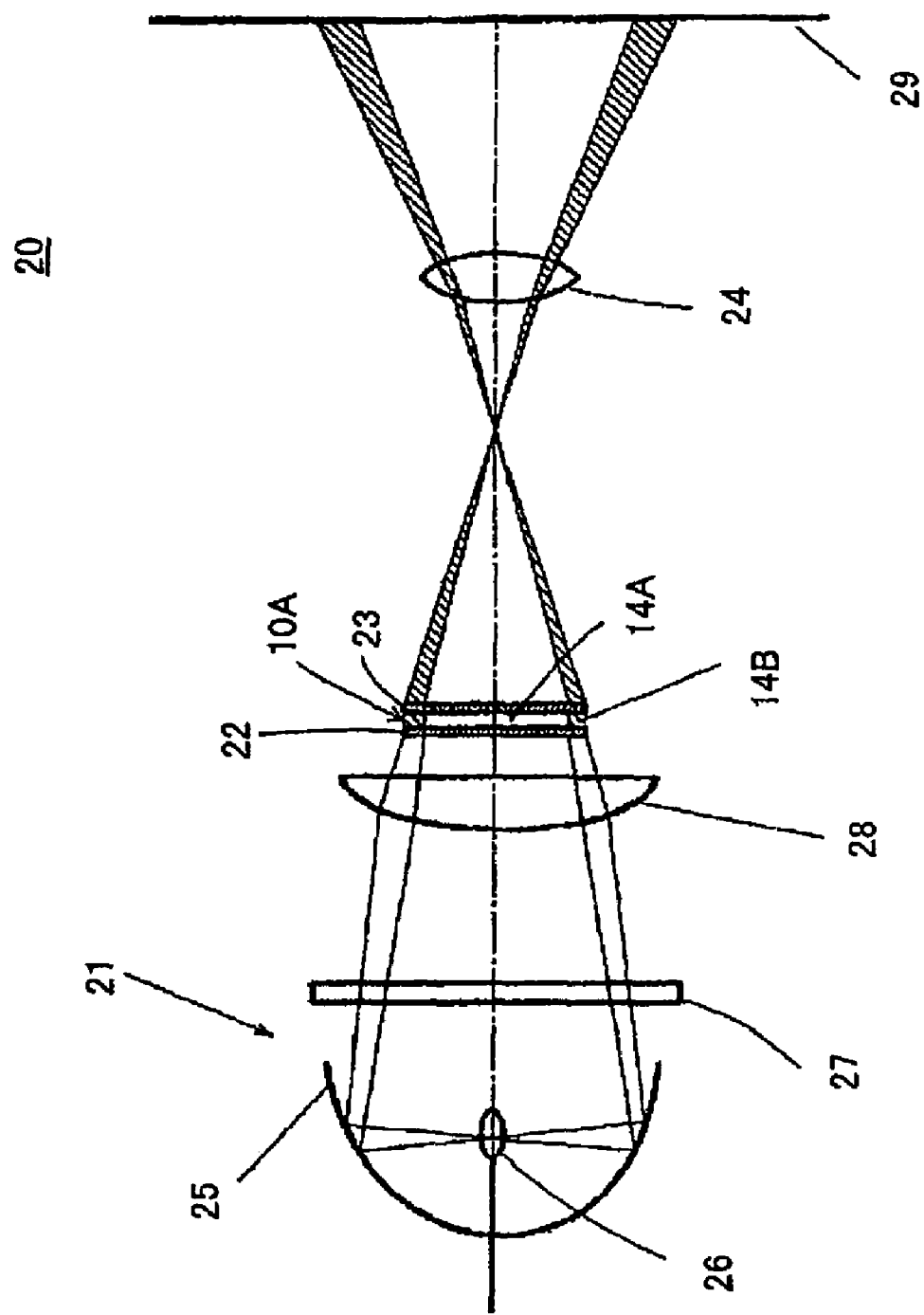
FIG. 2 is a view of an example of the configuration of a projector using a liquid crystal display panel shown in FIG. 1.

This is found by forming an LCD panel having an active layer of pixel transistors corresponding to the grain size thereof and projecting and irradiating the light onto the screen in a dark room by an actual commercially available three-plate type projector or an optical projection system close to commercially available three-plate type projector optical irradiation conditions as shown in FIG. 2 and observing the image quality by the naked eye.

Accordingly, as shown in the graph of FIG. 5, by controlling the grain size of the polycrystalline silicon to 300 nm or less, it is possible to sufficiently suppress the leakage current of the pixel TFTs to 2 pA or less, preferably approximately 1 pA or less, even at the time of light irradiation.

On the other hand, TFTs using polycrystalline silicon having a small grain size as the active layer are lowered in drivability compared with TFTs using polycrystalline silicon having a large grain size as the active layer. Due in part to the fact that peripheral TFTs are sufficiently shielded from light by a parting plate or the like in the structure of the panel, transistor characteristics of a higher mobility of carriers and larger ON current value than the low photo-leakage current are demanded in the operation characteristics.

Therefore, in the present embodiment, the desired operation characteristics are obtained by controlling the average grain size of the polycrystalline silicon of the peripheral TFTs to 800 nm or more at which the ON current ION of the peripheral TFTs starts to be saturated as shown in FIG. 5. Due to this, a liquid crystal display device having both of a high light resistance and a good image quality able to handle an incident light amount corresponding to $5 \times 10^7$ (lx) in white light can be obtained.

Figure 6:
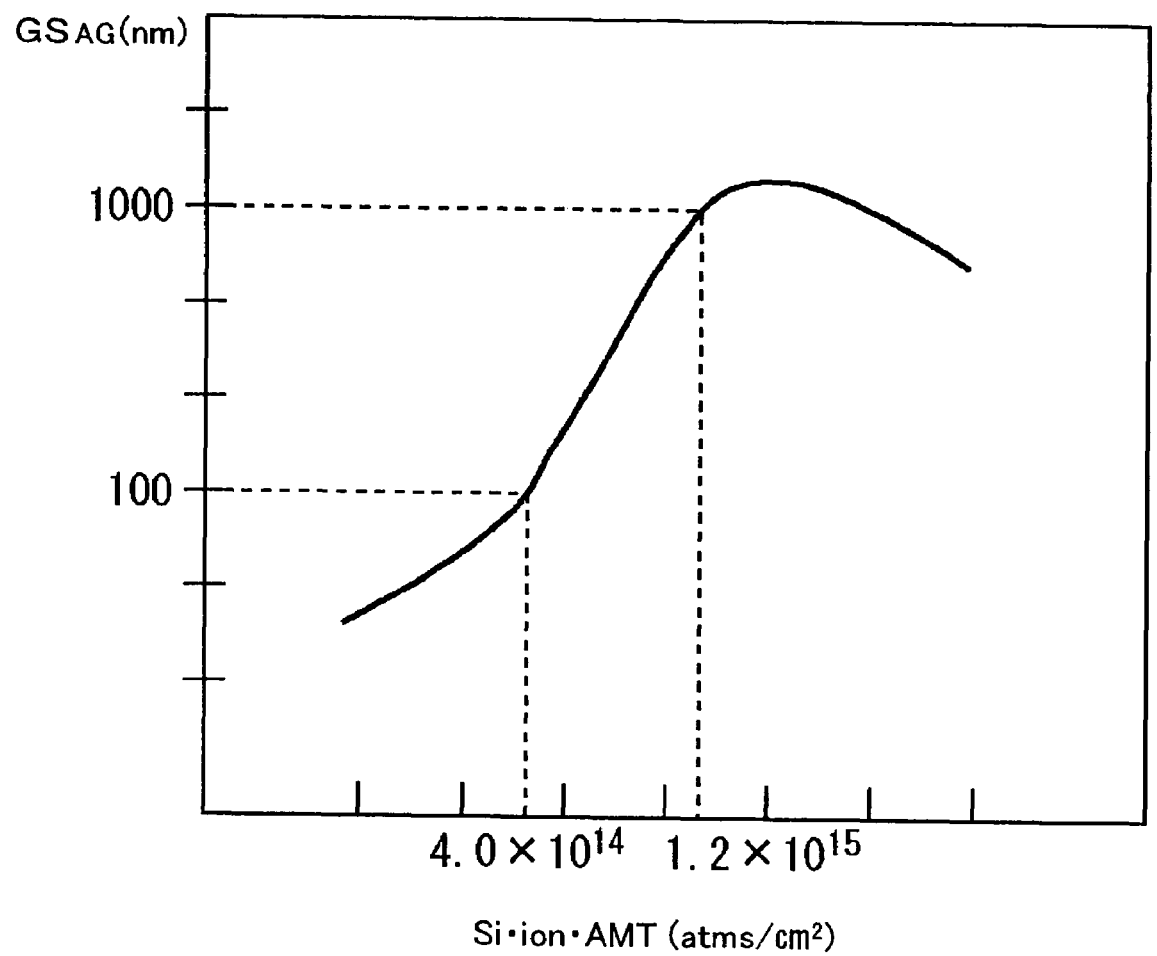
FIG. 6 is a graph of the relationship between an amount of implantation of silicon ions and an average grain size of the polycrystalline silicon after solid phase growth.

FIG. 6 is a graph showing the relationship between the implantation amount of the silicon ions and the average grain size of the polycrystalline silicon after the solid phase growth. In FIG. 6, the abscissa represents an Si ion implantation amount (Si ion AMT), and the ordinate represents a grain size GSAG of the polycrystalline Si after the solid phase growth.

As apparent from the figure, the larger the implantation amount of the silicon ions, the larger the grain size of the polycrystalline silicon after the recrystallization. For example, when the silicon ion implantation amount is $4.0 \times 10^{14}$ atoms/cm$^2$, the average grain size of the polycrystalline silicon is about 100 nm. Contrary to this, when the implantation amount of the silicon ions becomes $1.2 \times 10^{15}$ atoms/cm$^2$, the average crystal grain size of the polycrystalline silicon reaches 1000 nm and sometimes reaches about 2000 nm according to the conditions.

When the silicon ions are implanted, the polycrystalline structure at the time of the film formation is destroyed and becomes an amorphous structure once. At this time, portions serving as nuclei at the recrystallization in the following steps remain. The portions remained as the nuclei become larger when the implantation amount of silicon ions is smaller. Accordingly, when the recrystallization treatment is carried out in the following step, the crystal growth starts at the periphery of the individual nuclei, the crystal grains contact each other at the boundaries after a relatively short time, so the individual crystal grain size per se stays at a small stage. On the other hand, when the implantation amount of the silicon ions is increased and the amorphous state is approached, the density of the remaining nuclei is lowered. As a result, crystal becomes able to sufficiently grow at the periphery of the individual nuclei in the recrystallization treatment in the following step, so a relatively large grain size is obtained. Note that when the silicon ions are excessively implanted, the result completely becomes amorphous, so a state is exhibited where nuclei no longer remain.

The present embodiment utilizes this phenomenon, performs the ion implantation step so that the display unit has a smaller ion implantation amount than the drive unit, and thereby controls the average crystal grain size of the crystal silicon film of the pixel transistors obtained in the recrystallization step to become smaller than the average crystal grain size of the polycrystalline silicon film of the peripheral transistors.

Below, embodiments of the method of production of the display device according to the present invention will be explained in detail with reference to A and B of FIG. 7 to FIG. 9. Note that, in the process drawings shown in A and B of FIG. 7 to FIG. 9, in the figures, the left side portion represents a pixel TFT forming region, and the right side represents a peripheral TFT forming region. In the present embodiment, the pixel TFTs and the peripheral TFTs are integratedly formed simultaneously and parallel at both regions of these pixel TFT forming region and peripheral TFT forming region.

First, as shown in FIG. 7A, a synthetic quartz or other transparent insulating substrate 101 has formed on it at the pixel transistor forming region a first light shielding film 13 made of a WSi or other silicide film or metal film to a thickness of for example 200 nm in order to prevent return light from a back surface from striking the pixel transistor.

Thereafter, the first inter-layer insulating film 115 made of SiO$_2$ or the like is formed on the entire surface of the substrate 101 by CVD or the like. On that, the polycrystalline silicon film 111 forming the active layer of the pixel transistor and the peripheral transistor is formed by CVD. At this time, desirably the thickness of the polycrystalline silicon is adjusted to 20 to 80 nm. In the present embodiment, the thickness of the polycrystalline silicon film 111 is set to 40 nm to 45 nm.

Next, as shown in FIG. 7B, the polycrystalline silicon film 111 is implanted with an electrically inactive impurity containing mainly silicon in exactly the suitable amount so as to obtain a homogeneous amorphous silicon film. In the present embodiment, $Si^+$ is implanted as an inactive impurity not exerting an influence upon the energy level of the active layer of the TFT by an ion implantation apparatus. The implantation amount at this time is adjusted so that a desired crystal grain size is obtained in the pixel transistor after the solid phase growth. In the present embodiment, the ion implantation amount is adjusted to $4\times10^{14}$ atoms/cm$^2$ so that the average crystal grain size of the polycrystalline silicon film after the solid phase growth becomes about 100 nm. Note that an acceleration energy of the $Si^+$ ions is set to 30 keV to 50 keV.

Figure 8A:
FIGS. 8A and 8B are process diagrams of a first method of production of a display device according to the present invention.

Next, the pixel transistor forming region is covered by a resist 121 or the like as shown in FIG. 8A, and an electrically inactive impurity mainly containing in the same way as the previous step is implanted into only the peripheral transistor forming region in a suitable amount. The sum of the implantation amount at this time and the implantation amount in the previous step is adjusted so that the desired crystal grain size is obtained in the peripheral transistor after the solid phase growth. In the present embodiment, by performing adjustment so that the sum of the implantation amount at the first time and the implantation amount at the second time becomes $1.2\times10^{15}$ atoms/cm$^2$, the average crystal grain size of the polycrystalline silicon film after the solid phase growth is made to exceed 1000 nm. The acceleration energy at this time is 30 keV to 50 keV in the same way as the first implantation. In this way, in the present embodiment, the resist is selectively formed in only the pixel TFT forming region, while the implantation of the silicon ions is divided to two stages, to thereby make the implantation amounts different.

In place of this, it is also possible to implant ions by the ion implantation apparatus while scanning the entire surface of the substrate and at that time control the scanning so that the implantation amount differs between the pixel TFT forming region and the peripheral TFT forming region. Alternatively, it may also be considered to implant ions in the entire surface of the substrate under the same conditions after forming a thin oxide film at only the pixel TFT forming region in advance. In this case, part of the silicon ions irradiated to the pixel TFT forming region is captured by the oxide film, so the actual implantation amount becomes lower than that in the peripheral TFT forming region. In this way, the present invention can employ a variety of measures to make the implantation amounts differ between the regions.

Then, after peeling off the resist 121, by performing the solid phase growth in the amorphous silicon film by the heat treatment of about 600° C. to 650° C., the polycrystalline silicon film can be obtained. In the present embodiment, by putting the substrate 101 into the furnace set up at about 600° C. for 12 hours, the recrystallization treatment by the solid phase growth is carried out. As a result, in the pixel transistor forming region, the average grain size became about 100 nm. On the other hand, in the peripheral transistor forming region, a polycrystalline silicon film 111 of about 1000 nm could be simultaneously obtained. Note that, in some cases, in place of the solid phase growth process, it is also possible to recrystallize the amorphous silicon to polycrystalline silicon by annealing by laser beam irradiation using an excimer laser beam source or the like.

Figure 8B:
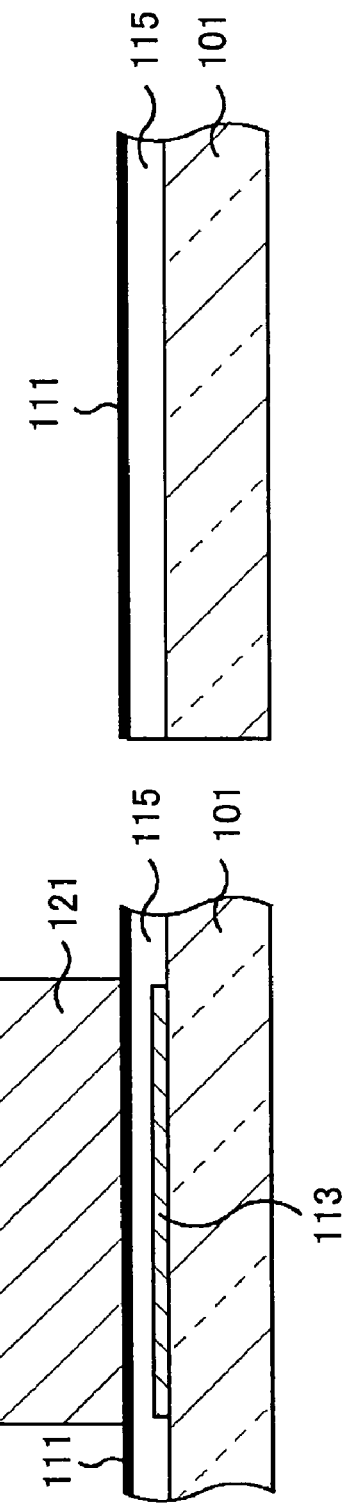

Then, as shown in FIG. 8B, the polycrystalline silicon film 111 is patterned to the shapes of the element regions of the transistors by photolithography and dry etching. Gate electrodes 112 are arranged on these via the gate insulating film 125 made of $SiO_2$ or the like to form the basic structures of the pixel transistor and the peripheral transistor. At this time, the thickness of the gate insulating film 125 is about 80 nm. Further, as the gate electrodes 112, use is made of polycrystalline silicon or WSi or another silicide compound.

Then, as shown in FIG. 9A, a second inter-layer insulating film 116 made of $SiO_2$ or the like is formed to a thickness of for example 600 nm by CVD. This second inter-layer insulating film 116 is formed with contact holes for inter-layer connection by dry etching, then interconnects 119 are formed. At the pixel TFT side, the interconnects 119 include a second light shielding film acting also as data interconnects. For this reason, the interconnects 119 are constituted by one or more layers of a metal such as W, Al, Cu, or Ti or a silicide compound providing a light shielding property. The thickness of the interconnects 119 is generally about 400 to 800 nm. The interconnects 119 are suitably patterned by photolithography and dry etching in accordance with the design.

Finally, as shown in FIG. 9B, a third inter-layer insulating film 117 made of $SiO_2$ is stacked by plasma CVD or the like. Further, the surface of the third inter-layer insulating film 117 is smoothened by CMP (chemical mechanical polishing) or the like. Here, after forming contact holes for inter-layer connection in the third inter-layer insulating film 117 by dry etching, a third light shielding film 114 made of a metal such as W, Ti, Cr or Al or a silicide compound is formed. This third light shielding film 14 is formed so as to cover the pixel TFT and has a thickness of a value large enough to block light. For example, in the case of a third light shielding film 114 made of Ti, desirably the thickness is controlled to 200 nm or more. Further, a pixel electrode 120 made of a transparent conductive film such as ITO is formed via the fourth inter-layer insulating film 118.

By the above, pixel TFTs and peripheral TFTs are simultaneously integratedly formed on the insulating substrate 101, and thus the TFT substrate is completed. Note that, thereafter, although not illustrated, the TFT substrate and the counter substrate are bonded together and liquid crystal is injected into the gap between the two so as to complete the liquid crystal display device.

As explained above, according to the present embodiment, the average crystal grain size of the semiconductor thin film of the pixel transistor and the average crystal grain size of the semiconductor thin film of the peripheral transistor are separately optimized. By this, in the display device having the same numerical aperture as that of the conventional one or the light shielding structure, it has become possible to greatly enhance a lowering of the image quality such as the flickering due to the photo-leakage, the roughness and the lowering of the contrast.

Further, by applying such a display device to a projector, the permissible amount of the incident light of the LCD is enlarged and a brighter and smaller sized projector can be realized. Further, it is possible to improve the light resistance without degrading the numerical aperture.

By selectively forming the polycrystalline silicon in the active layers of the pixel transistors and the peripheral transistors, the low photo-leakage property required for pixel transistors and the high mobility required for peripheral transistors can both be obtained. According to the present invention, TFT substrates having polycrystalline silicon films having different grain sizes region-wise can be produced uniformly and in large amounts.

Note that, in the above embodiment, as the method of separately optimizing the average crystal grain size of the semiconductor thin film (active layer) of the pixel transistors and the average crystal grain size of the active layer (semiconductor thin film) of the peripheral transistors, the explanation was given taking as an example the method of performing this so that the implantation amounts of the Si ions were different, but the present invention is not limited to this. For example, as the method of separately optimizing the average crystal grain sizes of the active layers (semiconductor thin films) of the pixel transistors and the peripheral transistors, a second method of production of changing the thicknesses of the amorphous silicon layers in the pixel transistors and the peripheral transistors and solid phase growing the Si or a third method of production of solid phase growing the Si from the amorphous silicon (a-Si) can be employed.

Below, an explanation will be given of the second method of production and the third method of production in relation to the drawings. Note that, in the following explanation, for facilitating understanding, the same notations are used for same components as those of A and B of FIG. 7 to FIG. 9.

First, an explanation will be given of the second method of production in relation to A and B of FIG. 10 and FIG. 11.

First, as shown in FIG. 10A, a synthetic quartz or another transparent insulating substrate 101 has formed on it at the pixel transistor forming region a first light shielding film 13 made of a WSi or other silicide film or a metal film to a thickness of for example 200 nm in order to prevent the return light from the back surface from striking the pixel transistor.

Thereafter, a first inter-layer insulating film 115 made of $SiO_2$ or the like is formed on the entire surface of the substrate 101 by CVD or the like.

On that, a polycrystalline silicon film 111 forming the active layer of the pixel transistor and the peripheral transistor is formed by $SiH_4$-based low pressure CVD. At this time, the thickness of the polycrystalline silicon is adjusted to for example 50 nm. In this case, the temperature in the furnace is set to about 620° C., the vacuum degree is set to 0.1 Torr, and the $SiH_4$ is set to 150 sccm.

Next, as shown in FIG. 10B, the polycrystalline silicon film 111 is selectively patterned by for example photolithography and dry etching so that the thickness at the pixel transistor becomes 30 nm and the thickness at the peripheral transistor is held at 50 nm. For example, use is made of a parallel flat plate type RIE apparatus. In this case, the RF power is set to 150 W/cm$^2$, the degree of vacuum is set to 0.2 to 0.4 Pa, the flow rate of $CL_2$ gas is set to 180 ml/min, and the flow rate of $O_2$ gas is set to 6 ml/min.

Figure 11A:
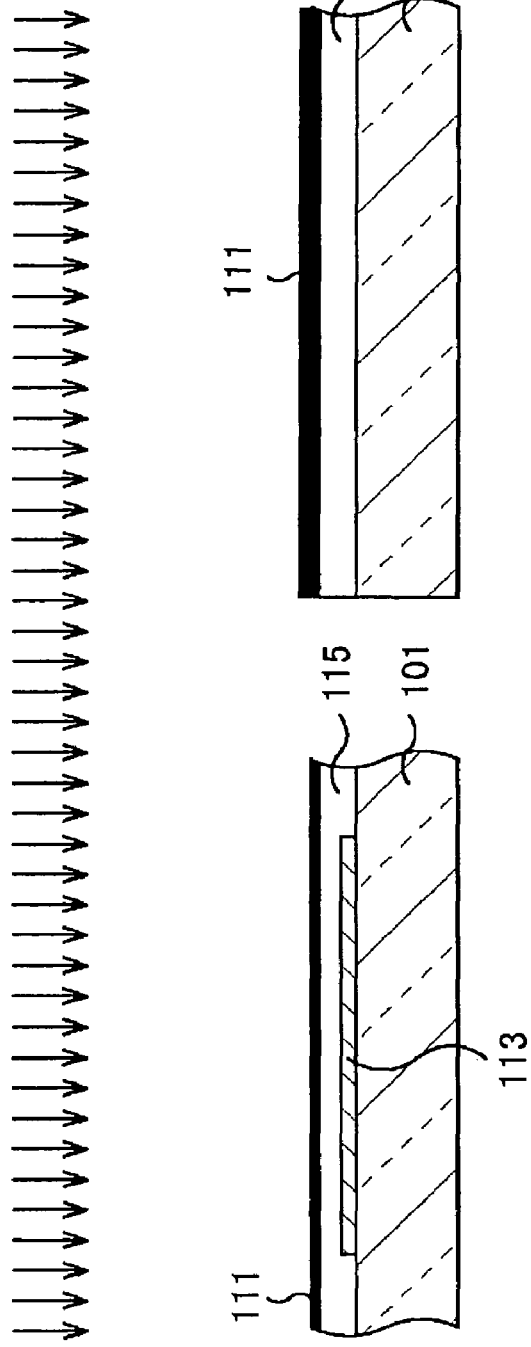
FIGS. 11A and 11B are process diagrams of a second method of production of the display device according to the present invention.
Figure 11B:
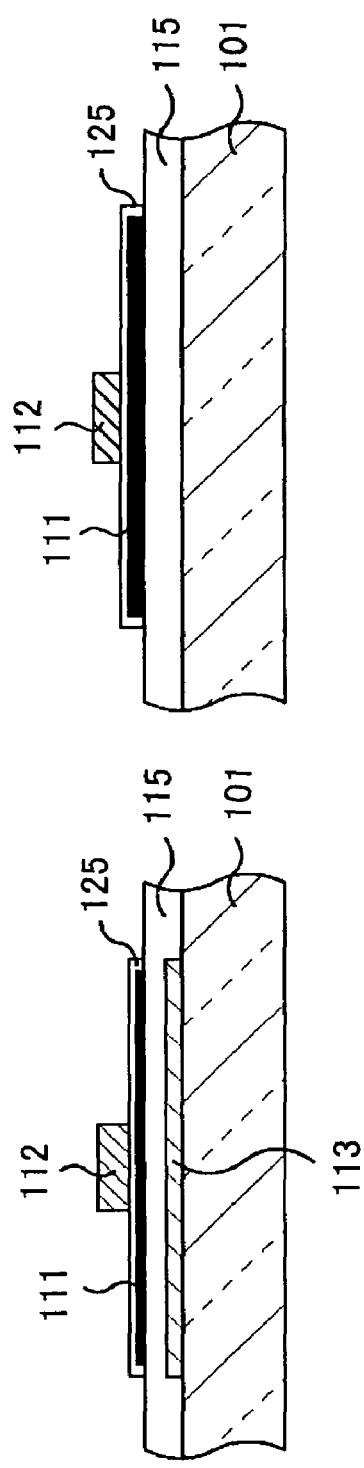

Next, as shown in FIG. 11A, the polycrystalline silicon film 111 is implanted with an electrically inactive impurity mainly containing silicon in exactly the suitable amount to obtain a homogeneous amorphous silicon film. In the present embodiment, the Si$^+$ is implanted by an ion implantation system as an inactive impurity not exerting an influence upon the energy level of the active layer of the TFTs. The implantation amount at this time is adjusted so that the desired crystal grain size is obtained in the pixel transistor after the solid phase growth. In this case, for example the ion implantation amount is set to $2 \times 10^{15}$ atms/cm$^2$, and the acceleration energy of the Si$^+$ ion is set to 30 keV to 50 keV, preferably 40 keV.

Then, by heat treating the amorphous silicon film for solid phase growth, a polycrystalline silicon film can be obtained. In this case, by loading it in an atmosphere of $N_2$ gas at a temperature of 600° C. for 24 hours, recrystallization is performed by solid phase growth. As a result, the average crystal grain size after the solid phase growth in the pixel TFT forming region became about 250 nm, and the average crystal grain size after the solid phase growth in the peripheral TFT forming region became about 1500 nm.

Then, as shown in FIG. 10B, the polycrystalline silicon film 111 is patterned to the shapes of the element regions of the transistors by photolithography and dry etching. Gate electrodes 112 are arranged on them via a gate insulating film 125 made of $SiO_2$ or the like to form the basic structures of the pixel transistor and the peripheral transistor. At this time, the thickness of the gate insulating film 125 is about 80 nm. Further, as the gate electrodes 112, use is made of polycrystalline silicon or WSi or other silicide compound.

The following steps are carried out in the same way as FIGS. 9A and 9B, so a detailed explanation thereof is omitted here.

Next, an explanation will be given of the third method of production in relation to FIGS. 12A to 12C and FIGS. 13A and 13B.

First, as shown in FIG. 12A, a synthetic quartz or other transparent insulating substrate 101 has formed on it at the pixel transistor forming region a first light shielding film 13 made of a WSi or other silicide film or metal to a thickness of for example 200 nm in order to prevent return light from the back surface from striking the pixel transistor.

Thereafter, a first inter-layer insulating film 115 made of $SiO_2$ or the like is formed on the entire surface of the substrate 101 by CVD or the like.

On that, an a-Si film 111a forming the active layers of the pixel transistor and the peripheral transistor is formed by $Si_2H_6$-based low pressure CVD. At this time, the thickness of the a-Si film is adjusted to for example 20 nm. In this case, for example the temperature in the furnace is set to about 425° C., the degree of vacuum is set to 1.2 Torr, and the $Si_2H_6$ is set to 300 sccm.

Next, as shown in FIG. 12B, selective peeling the thickness of the a-Si film 111a in the pixel transistor is performed by for example etching while holding the thickness at the peripheral transistor at 20 nm as they are. For example, use is made of a parallel flat plate type RIE system. In this case, the RF power is set to 150 W/cm$^2$, the degree of vacuum is set to 0.2 to 0.4 Pa, the flow rate of the $CL_2$ gas is set to 180 ml/min, and the flow rate of the $O_2$ gas is set to 6 ml/min.

Next, after lightly peeling off the natural oxide film by for example an HF-based etchant, as shown in FIG. 12C, an a-Si film 111b forming the active layers of the pixel transistor and the peripheral transistor is formed by $Si_2H_6$-based low pressure CVD. At this time, the thickness of the a-Si film is adjusted to for example 30 nm. Accordingly, the thickness of the a-Si film 111b of the pixel TFT forming region becomes for example 30 nm, and the thickness of the a-Si film 111b of the peripheral TFT forming region becomes 50 nm. Also in this case, for example the temperature in the furnace is set to about 425° C., the degree of vacuum is set to 1.2 Torr, and the $Si_2H_6$ is set to 300 sccm.

Next, as shown in FIG. 13A, the a-Si film 111b is implanted with an electrically inactive impurity mainly containing silicon in exactly the suitable amount to obtain a homogeneous amorphous silicon film. In the present embodiment, the Si$^+$ is implanted by an ion implantation apparatus as an inactive impurity not exerting an influence upon the energy level of the active layer of the TFT. The implantation amount at this time is adjusted so that the desired crystal grain size is obtained in the pixel transistor after the solid phase growth. In this case, for example the ion implantation amount is set to $5 \times 10^{13}$ atms/cm², and the acceleration energy of the Si⁺ ion is set to 30 keV to 50 keV, preferably 40 keV.

Then, by heat treating the amorphous silicon film for solid phase growth, a polycrystalline silicon film can be obtained. In this case, by loading it in an atmosphere of $N_2$ gas at a temperature of 600° C. for 10 to 30 hours, preferably 24 hours, recrystallization is performed by solid phase growth. As a result, the average crystal grain size after the solid phase growth in the pixel TFT forming region became about 200 nm, and the average crystal grain size after the solid phase growth in the peripheral TFT forming region became about 1000 nm.

Nuclei are generated less from the interior of the film and more from an interface with the substrate, the a-Si film surface when performing solid phase growth from the a-Si film or from the interface between the first layer and the second layer when growing two layers. In this case, it can be considered that the smaller the thickness, the larger the effect of the interface and the smaller the average crystal grain size. Further, in forming the a-Si film by low pressure CVD (LPCVD), there is an extremely small region which does not completely become amorphous. Sometimes nuclei are generated from there. Accordingly, it is possible to implant ions by $1 \times 10^{12}$ to $10^{15}$ atoms/cm² into the a-Si film by LPCVD. This is for completely changing the minute nuclei to become amorphous. Particularly, this is effective in the case of two-layer growth. In this case, preferably ions are implanted by $1 \times 10^{13}$ atoms/cm².

Of course, even under LPCVD growth conditions, such minute nucleus regions become hard to form. For example, in an $SiH_4$ system, desirably the temperature is less than 550° C., and in an $Si_2H_6$ system, a temperature less than 430° C. is desirable when also taking into account the growth rate.

Then, as shown in FIG. 13B, the polycrystalline silicon film 111 is patterned to the shapes of the element regions of the transistors by photolithography and dry etching. Gate electrodes 112 are arranged on them via a gate insulating film 125 made of $SiO_2$ or the like to form the basic structures of the pixel transistor and the peripheral transistor. At this time, the thickness of the gate insulating film 125 is about 80 nm. Further, as the gate electrodes 112, use is made of polycrystalline silicon or WSi or another silicide compound.

The following steps are carried out in the same way as FIGS. 9A and 9B, so a detailed explanation thereof is omitted here.

Note that, in the second method of production, the a-Si system may be used for formation, and in the third method of production, the polycrystalline Si system may be used for formation.

Further, the step of forming the gate oxide film employs LPCVD of $SiH_4$, but also the usual high temperature (heat) oxidation may be naturally carried out. At this time, it is necessary to form the polycrystalline Si to about 80 nm in the peripheral TFT forming region and to about 50 nm in the pixel TFT forming region and to adjust the thickness of the oxide film. In this case, the thickness of the oxide film in for example the peripheral TFT forming region becomes 50 nm, the thickness of the oxide film in the pixel TFT forming region becomes 50 nm, and the thickness of the remaining polycrystalline Si film becomes 55 nm in the peripheral TFT forming region and becomes 25 nm in the pixel TFT forming region.

According to the above method, in actuality, an average grain size of 150 nm to 200 nm was obtained in the pixel TFT forming region, and an average grain size of about 2000 to 2500 nm was obtained in the active layer in the peripheral TFT forming region.

Figure 14:
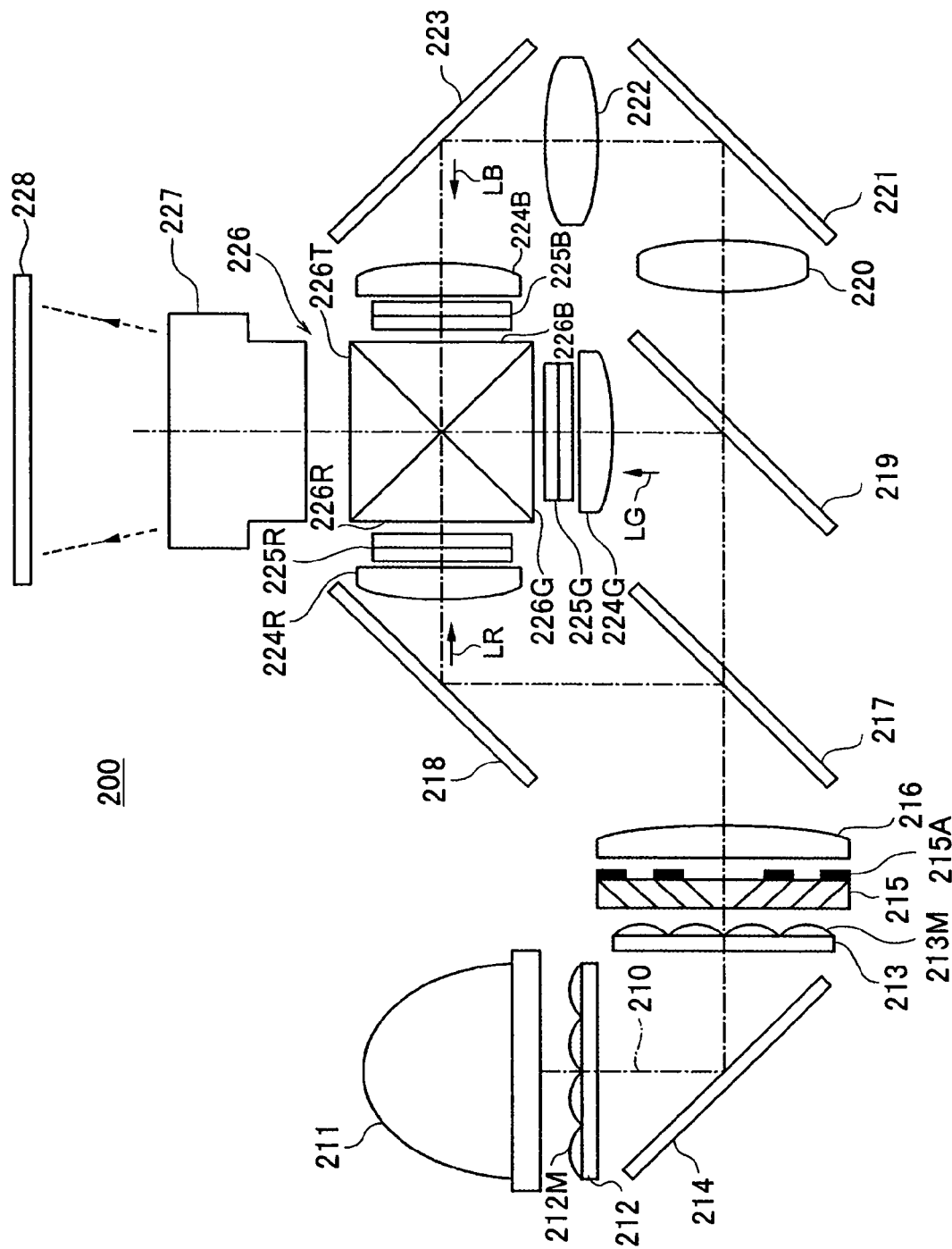
FIG. 14 is a view of an example of the overall configuration of a three-plate type projector (projection type display device) using a liquid crystal display panel according to the present embodiment.

The display device prepared as described above can be used as the light valve of the projector shown in FIG. 2, namely as a liquid crystal display panel, but can also be applied to a so-called three-plate system projector as shown in FIG. 14 for color image display using three transmission type liquid crystal display panels.

FIG. 14 is a view of an example of the overall configuration of a three-plate system projector (projection type display device) as an example of application of the display device (liquid crystal display panel) according to the present embodiment.

A projector 200 shown in FIG. 14 is a so-called three-plate system for color image display by using three plates of the transmission type liquid crystal display panels. The liquid crystal display panels 225R, 225G, and 225B shown in FIG. 14 have the structures shown in FIG. 3 and A and B of FIG. 4.

The projector is provided with a light source 211 emitting light, a pair of first and second lens arrays 212 and 213, and a total reflection mirror 214 provided between the pair of first and second lens arrays 212 and 213 and arranged so as to bend the optical path (optical axis 210) to the second lens array 213 side by approximately 90 degrees. In the first and second lens arrays 212 and 213, a plurality of micro lenses 212M and 213M are two-dimensionally arranged. The first and second lens arrays 212 and 213 are for making the illuminance distribution of the light uniform and have the function of dividing the incident light to a plurality of small light bundles.

The light source 211 emits the white light including red light, blue light, and green light required for the color image display. The light source 211 is constituted by including a not illustrated luminous element for emitting the white light and a concave surface mirror for reflecting and focusing the light emitted from the luminous element. As the luminous element, use is made of for example a halogen lamp, a metal halide lamp, a xenon lamp, or the like. The concave surface mirror desirably has a shape having a good condensing efficiency and exhibits for example a rotary symmetric surface shape for example a spheroid mirror or a paraboloid mirror.

On the emitting side of the light of the second lens array 213, a PS combiner 215, a condenser lens 216, and a dichroic mirror 217 are sequentially arranged. The dichroic mirror 217 separates the incident light to for example a red colored light LR and the other colored lights.

The PS combiner 215 is provided with a plurality of ½ wavelength plates 215A at a location corresponding to a space between adjacent micro lenses 213M in the second lens array 213. The PS combiner 215 has the function of separating the incident light to polarization lights of a P polarization component and an S polarization component. Further, the PS combiner 215 has a function of emitting one polarization light between the separated two polarization lights from the PS combiner 215 while holding its polarization direction (for example P polarization), and converting the other polarization light (for example S polarization light) to the other polarization component (P polarization component) by the function of the ½ wavelength plate 215A and emitting this.

Along the optical path of the red colored light LR separated by the dichroic mirror 217, a total reflection mirror 218, a field lens 224R, and a liquid crystal display panel 225R are sequentially arranged. The total reflection mirror 218 reflects the red colored light LR separated by the dichroic mirror 217 toward the liquid crystal display panel 225R. The liquid crystal display panel 225R spatially modulates the red colored light LR incident via the field lens 224R in accordance with the image signal.

Along the optical path of the other colored light separated by the dichroic mirror 217, a dichroic mirror 219 is provided.

The dichroic mirror 219 separates the incident light to for example a green colored light LG and a blue colored light LB.

Along the optical path of the green colored light LG separated by the dichroic mirror 219, a field lens 224G and a liquid crystal display panel 225G are sequentially arranged. The liquid crystal display panel 225G spatially modulates the green colored light LG incident via the field lens 224G in accordance with the image signal.

Along the optical path of the blue colored light LB separated by the dichroic mirror 219, a relay lens 220, a total reflection mirror 221, a relay lens 222, a total reflection mirror 223, a field lens 224B, and a liquid crystal display panel 225B are sequentially arranged. The total reflection mirror 221 reflects the blue colored light LB incident via the relay lens 220 toward the total reflection mirror 223. The total reflection mirror 223 reflects the blue colored light LB reflected at the total reflection mirror 221 and incident via the relay lens 222 toward the liquid crystal display panel 225B. The liquid crystal display panel 225B spatially modulates the blue colored light LB reflected at the total reflection mirror 223 and incident via the field lens 224B in accordance with the image signal.

At the location where the optical paths of the red colored light LR, the green colored light LG, and the blue colored light LB cross, a cross prism 226 having a function of combining three colored lights LR, LG, and LB is arranged. Further, a projection lens 227 for projecting the combined light emitted from the cross prism 226 toward a screen 228 is provided.

The cross prism 226 has three incident surfaces 226R, 226G, and 226B and one emission surface 226T. The incident surface 226R is struck by the red colored light LR emitted from the liquid crystal display panel 225R. The incident surface 226G is struck by the green colored light LG emitted from the liquid crystal display panel 225G. The incident surface 226B is struck by the blue colored light LB emitted from the liquid crystal display panel 225B. The cross prism 226 combines the three colored lights incident upon the incident surfaces 226R, 226G, and 226B and emits the same from the emission surface 226T.

When applying the liquid crystal display panel according to the present embodiment to the projector using a very strong light source as described above, polycrystalline or amorphous non-single crystalline silicon having a low photosensitivity is used for the active layer of the pixel transistors from which high light resistance rather than high speed drive is required and single crystalline silicon is used for the active layer of the drive transistors relatively strong against malfunctions due to light on the circuit characteristics and from which high speed drive rather than light resistance is required, therefore both light resistance and high speed drive can be achieved and the display quality of the projector can be raised.

INDUSTRIAL APPLICABILITY

As explained above, the display device and its method of production of the present invention can achieve both the low photo-leakage property required for the pixel transistors and the high mobility required for the peripheral transistors by selectively forming polycrystalline silicon in the active layers of the pixel transistors and the peripheral transistors, so it is possible to apply them to a liquid crystal display device and projector having a general numerical aperture or light shielding structure.

The invention claimed is:

1. A projection type display device emitting light of a light source to at least one display panel to project an image formed by that display panel to a screen, wherein
said display panel comprises a substrate on which a display unit and a peripheral drive unit are integrally formed,
said display unit having pixels arranged in a matrix and pixel transistors integrally formed,
said drive unit having peripheral transistors of a drive circuit for scanning the matrix of the pixel transistors, and
both of said pixel transistors and peripheral transistor being thin film transistors comprising at least one polycrystalline semiconductor thin film,
wherein an average crystal grain size of the polycrystalline semiconductor thin film of said pixel transistors and an average crystal grain size of the polycrystalline semiconductor thin film of said peripheral transistors are different,
wherein the thickness of the polycrystalline silicon constituting the semiconductor thin film of said pixel transistors is smaller than the thickness of the polycrystalline silicon constituting the semiconductor thin film of said peripheral transistors;
wherein the pixel transistors are formed with a first light shielding film between the pixel transistors and the substrate and a second light shielding film formed above the pixel transistors; and
wherein source and drain interconnects formed over said pixel transistors function as a third light shielding film, and wherein said second light shielding film is formed over said source and drain interconnects and is electrically connected to one of said source and drain interconnects, and further comprising a substantially transparent pixel electrode formed over said second light shielding film and electrically connected to said second light shielding film.

2. The projection type display device as set forth in claim 1, wherein the average crystal grain size of the polycrystalline semiconductor thin film of said pixel transistors is smaller than the average crystal grain size of the polycrystalline semiconductor thin film of said peripheral transistors.

3. The projection type display device as set forth in claim 2, wherein the average crystal grain size of the polycrystalline silicon constituting the polycrystalline semiconductor thin film of said pixel transistors is 300 nm or less, and the average crystal grain size of the polycrystalline silicon constituting the semiconductor thin film of said peripheral transistors is 800 nm or more.

4. The projection type display device as set forth in claim 2, wherein the thickness of said polycrystalline silicon is 25 to 50 nm.

5. A projection type display device emitting light of a light source to at least one display panel to project an image formed by that display panel to a screen, wherein
said display panel comprises a substrate on which a display unit and a peripheral drive unit are integrally formed,
said display unit having pixels arranged in a matrix and pixel transistors integrally formed,
said drive unit having peripheral transistors of a drive circuit for scanning the matrix of the pixel transistors, and
both of said pixel transistors and peripheral transistor being thin film transistors comprising at least one polycrystalline semiconductor thin film, wherein an average crystal grain size of the polycrystalline semiconductor thin film of said pixel transistors and an average crystal grain size of the polycrystalline semiconductor thin film of said peripheral transistors are different, and wherein an impurity concentration of the polycrystalline semiconductor thin film of said pixel transistors and an impurity concentration of the polycrystalline semiconductor thin film of said peripheral transistors are different; and wherein source and drain interconnects formed over said pixel transistors function as a third light shielding film, and wherein said second light shielding film is formed over said source and drain interconnects and is electrically connected to one of said source and drain interconnects, and further comprising a substantially transparent pixel electrode formed over said second light shielding film and electrically connected to said second light shielding film.

6. The projection type display device as set forth in claim 5, wherein the thickness of the polycrystalline silicon constituting the semiconductor thin film of said pixel transistors is smaller than the thickness of the polycrystalline silicon constituting the semiconductor thin film of said peripheral transistors.

7. The projection type display device as set forth in claim 5, wherein said semiconductor thin film is polycrystalline silicon.

8. The projection type display device as set forth in claim 5, wherein the pixel transistors are formed with a first light shielding film between the pixel transistors and the substrate and a second light shielding film formed above the pixel transistors.

9. The projection type display device as set forth in claim 5, wherein said impurity concentration is a concentration of implanted ions that do not exert an influence upon electrical characteristics of the active layer of the pixel or peripheral transistors.

10. The projection type display device as set forth in claim 5, wherein said implanted ions are $Si^+$ or $SiF_3^+$ ions.

* * * * *